(12) United States Patent
Rhodes

(10) Patent No.: US 7,196,314 B2
(45) Date of Patent: Mar. 27, 2007

(54) IMAGE SENSOR AND PIXEL HAVING AN ANTI-REFLECTIVE COATING OVER THE PHOTODIODE

(75) Inventor: Howard E. Rhodes, Boise, ID (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 37 days.

(21) Appl. No.: 10/985,171

(22) Filed: Nov. 9, 2004

(65) Prior Publication Data

US 2006/0097134 A1 May 11, 2006

(51) Int. Cl.
*H01L 31/00* (2006.01)
(52) U.S. Cl. .................... 250/214.1; 257/437
(58) Field of Classification Search ............ 250/208.1, 250/214.1, 216; 257/437
See application file for complete search history.

(56) References Cited

U.S. PATENT DOCUMENTS 5,177,581 A * 1/1993 Kubo et al. ................ 257/437
6,060,732 A * 5/2000 Murakami et al. .......... 257/215
6,555,410 B2    4/2003 Tsang ........................ 438/69
6,635,912 B2 * 10/2003 Ohkubo ..................... 257/292
6,809,767 B1   10/2004 Kozlowski et al.
6,833,601 B2 * 12/2004 Murakami ................. 257/437
6,881,941 B1 *  4/2005 Janesick .................. 250/208.1
2004/0188597 A1 *  9/2004 Inoue et al. .............. 250/214 R

FOREIGN PATENT DOCUMENTS

JP          9153604         6/1997

* cited by examiner

*Primary Examiner*—Thanh X. Luu
*Assistant Examiner*—Stephen Yam
(74) *Attorney, Agent, or Firm*—Perkins Coie LLP

(57) ABSTRACT

A pixel for use in CMOS or CCD image sensors is disclosed. The pixel includes a light sensitive element, such as a photodiode, formed in a semiconductor substrate. An anti-reflective coating is formed over the photodiode to reduce reflection of incident light. The reduced reflection results in greater "signal" reaching the photodiode.

49 Claims, 4 Drawing Sheets

IMAGE SENSOR AND PIXEL HAVING AN ANTI-REFLECTIVE COATING OVER THE PHOTODIODE

TECHNICAL FIELD

The present invention relates to image sensors, and more particularly, to an image sensor that uses pixels having an anti-reflective coating atop of the photodiode.

BACKGROUND

Image sensors have become ubiquitous. They are widely used in digital still cameras, cellular phones, security cameras, medical, automobile, and other applications. The technology used to manufacture image sensors, and in particular CMOS image sensors, has continued to advance at great pace. For example, the demands of higher resolution and lower power consumption have encouraged the further miniaturization and integration of the image sensor.

As the pixels become smaller, the surface area that can receive incident light is also reduced. The pixel typically has a light-sensing element, such as a photodiode, which receives incident light and produces a signal in relation to the amount of incident light. Because of the small size of the light-sensing element, it is important that as much incident light is captured by the light-sensing element. One major source of incident light loss occurs as a result of reflection at the photodiode (the silicon surface) to oxide ($SiO_2$) interface. At this interface, a substantial amount of light is reflected with the consequential reduction in photodiode responsivity and quantum efficiency.

DETAILED DESCRIPTION

In the following description, numerous specific details are provided in order to give a thorough understanding of embodiments of the invention. One skilled in the relevant art will recognize, however, that the invention may be practiced without one or more of the specific details, or with other methods, components, materials, etc. In other instances, well known structures, materials, or operations are not shown or described in order to avoid obscuring aspects of the invention.

Referenced throughout the specification to "one embodiment" or "an embodiment" means that a particular feature, structure, or characteristic described in connection with the embodiment and included in at least one embodiment of the present invention. Thus, the appearances of the phrase "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
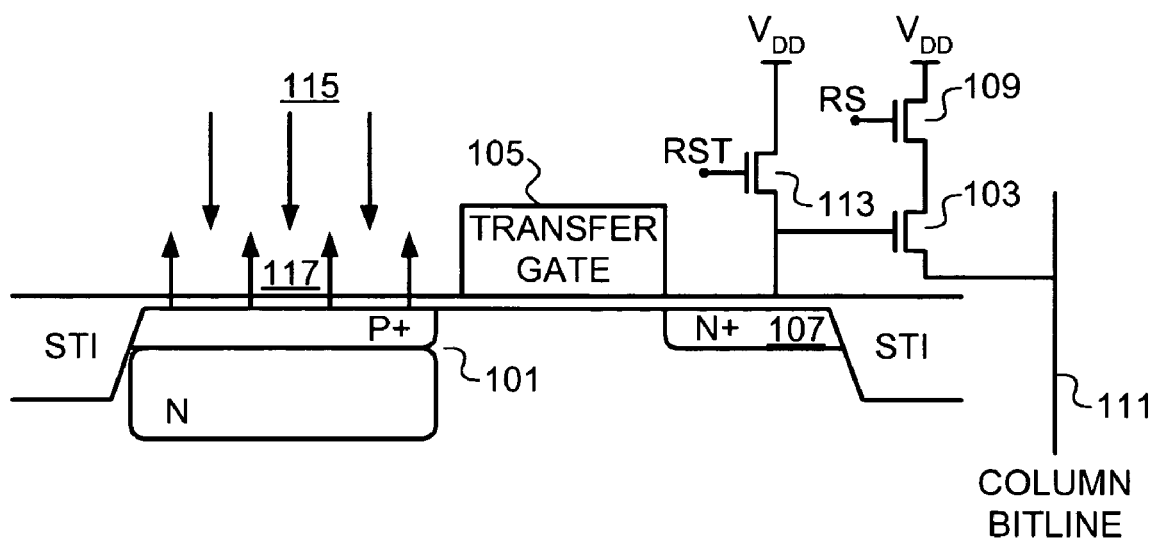
FIG. 1 is a combination cross-sectional and schematic diagram of a prior art four transistor (4T) pixel which shows in detail a photodiode formed in a substrate.

FIG. 1 shows a combination cross-sectional and schematic view of an active pixel that uses four transistors. This is known in the art as a 4T active pixel. A light-sensing element, in this embodiment a photodiode 101, outputs a signal that is used to modulate an amplification transistor 103. The amplification transistor 103 is also referred to as a source follower transistor. While the light-sensing element can be one of a variety of devices, including without limitation, photogates, photodiodes, pinned photodiodes, partially pinned photodiodes, etc., in the present invention, the light-sensing element is a photodiode (whether of the pinned, partially pinned, or unpinned variety). A transfer transistor 105 is used to transfer the signal output by the photodiode 101 to a floating node 107, which is connected to the gate of the amplification transistor 105. The transfer transistor 105 is controlled by a transfer gate.

A characteristic feature of a 4T active pixel is the presence of a transfer gate to enable true correlated double sampling (CDS). It is possible to eliminate the row select (RS) transistor in the 4T pixel to form a "4T active pixel" with just three transistors by additionally gating the supply voltage to the reset transistors. It is to be understood that this invention applies to all CMOS imagers whether they be formed with 3, 4, 5, 6, or more transistors. This invention also applies to CCD image sensors.

In operation, during an integration period (also referred to as an exposure or accumulation period), the photodiode 101 generates charge that is held in the N-type layer. After the integration period, the transfer transistor 105 is turned on to transfer the charge held in the N-type layer of the photodiode 101 to the floating node 107. After the signal has been transferred to the floating node 107, the transfer transistor 105 is turned off again for the start of a subsequent integration period.

The signal on the floating node 107 is then used to modulate the amplification transistor 105. Finally, an address transistor 109 is used as a means to address the pixel and to selectively read out the signal onto a column bit line 111. After readout through the column bit line 111, a reset transistor 113 resets the floating node 107 to a reference voltage. In one embodiment, the reference voltage is $V_{dd}$. Note that while the description herein discusses the present invention in the context of a 4T pixel, the present invention may be used with a 3T, 5T, 6T, 7T or other pixel designs. In fact, the use of the present invention may be applied to any light sensing element or with either CMOS or CCD image sensors.

Figure 1A:
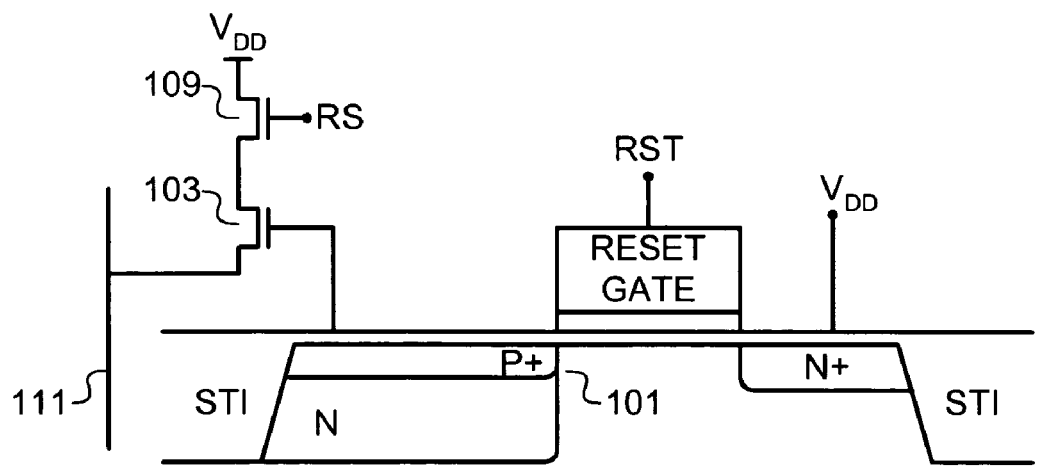
FIG. 1A is a combination cross-sectional and schematic diagram of a prior art three transistor (3T) pixel which shows in detail a photodiode formed in a substrate.

FIG. 1A shows a three transistor (3T) pixel design. In this design, the transfer transistor is omitted and the output node of the photodiode is directly connected to the amplification transistor 103. Further, the reset transistor 113 is adjacent the photodiode 101 and can selectively reset the output of the photodiode to the reference voltage $V_{dd}$.

As can be seen in FIGS. 1 and 1A, incident light 115 is incident onto the photodiode 101. However, some portion of the incident light 115 is reflected as reflected light 117. This reflected light 117 is "wasted", i.e. not sensed by the photodiode 101.

The present invention reduces the reflection from the surface of the photodiode 101 by adding an anti-reflective coating (ARC). The inclusion of an anti-reflective coating over the light sensing element (the photodiode) 101 substantially reduces the loss of incident light due to reflection. Note that while the description herein shows the application of the present invention with respect to CMOS pixels, the present invention can be equally applied to CCD pixels.

In one embodiment, the anti-reflective coating is placed close to the silicon surface and over the photodiode 101. In general, it has been found that the photodiode ARC should be transparent to light in the visible spectrum and have an index of refraction between that of the overlying oxide and the underlying silicon substrate (the photodiode region). In one embodiment, the ARC is silicon nitride ($Si_3N_4$). It should be noted that other types of anti-reflective coatings may also be suitable, such as those commercially available from Brewer Science of Rolla, Mo. Thus, that the use of silicon nitride is but one example of a suitable anti-reflective coating. For example, the ARC may be silicon oxynitride ($SiO_xN_y$) or a multilayer stack, such as $SiO_2/Si_3N_4$, $SiO_xN_y/Si_3N_4$, or $SiO_xN_y/Si_3N_4/SiO_wN_z$. Alternatively, a graded stack such as $SiO_xN_y/Si_3O_cN_w/SiO_q/N_u$ may be used.

Furthermore, the thickness of the silicon nitride anti-reflective coating layer should be chosen to be appropriate to eliminate reflections near the incident wavelengths that are being detected. For an image sensor that is designed to be sensitive to visible radiation, the thickness of the silicon nitride layer may be approximately 550 Angstroms.

Specifically, assume that the optimum nitride thickness is designated as $T_{OPT}$. Then, the following formula is an approximation of the value of $T_{OPT}$:

$$2N_{Nitride}T_{OPT} \approx \lambda/2$$

If we assume that the index of refraction $N_{Nitride}$ is approximately 2.1, then for an incident wavelength $\lambda$ of 4500 Angstroms (blue color), the thickness $T_{OPT}$ is approximately 535 Angstroms.

In other embodiments, where the spectrum of incident light varies approximately between 4000 to 7000 angstroms, this gives a range of thickness for the anti-reflective coating formed of silicon nitride of between approximately between 470 angstroms and 830 angstroms. While a range has been give, it can be appreciated that the thickness of the silicon nitride may be less than or more than the range depending upon the specific application. The thickness for any given application will depend on the index of refraction of the photodiode ARC. This photodiode ARC could be a multi-layer stack such as $SiO_xN_y/Si_3N_4$ or a material with a graded index of refraction. A material with a graded index of refraction can be formed by varying the flow of oxygen and nitrogen during the $SiO_xN_y$ deposition. This may result in the range of thickness of the ARC to be between 200 to 1500 angstroms, and perhaps in the narrower range of 300–1000 angstroms.

If the silicon nitride ARC is placed in direct contact with the silicon substrate, this will likely cause an increase in interface state density at the photodiode surface that may cause an increase in photodiode dark current. Furthermore, silicon nitride in contact with silicon is also known to result in stress to the underlying silicon. Therefore, in one embodiment, the silicon nitride anti-reflective coating is separated from the photodiode silicon surface. However, it can be appreciated in other embodiments, there may be other anti-reflective coatings that can be placed directly atop of the silicon surface without detrimental effect.

The present invention is intended to cover the broad concept of using an anti-reflective coating formed atop of a light-sensing element, such as a photodiode. Thus, while the described embodiment herein teaches the use of a silicon nitride anti-reflective coating atop of the photodiode silicon surface and separated by some type of buffering layer, the present invention should not be construed more broadly to eliminate the buffer layer.

Figure 2:
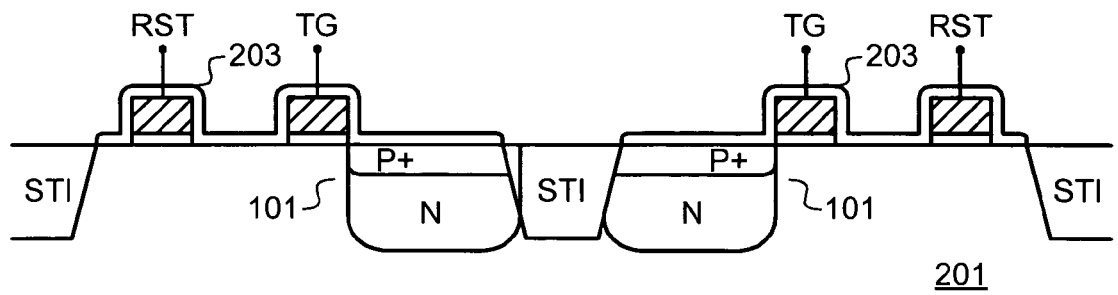
FIGS. 2–4 are cross sectional views illustrating the process of manufacturing a pixel with an anti-reflective coating in accordance with the present invention.
Figure 3:
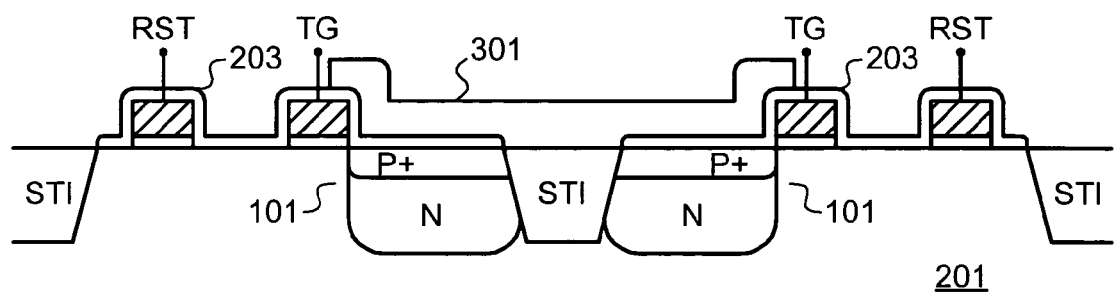
Figure 4:
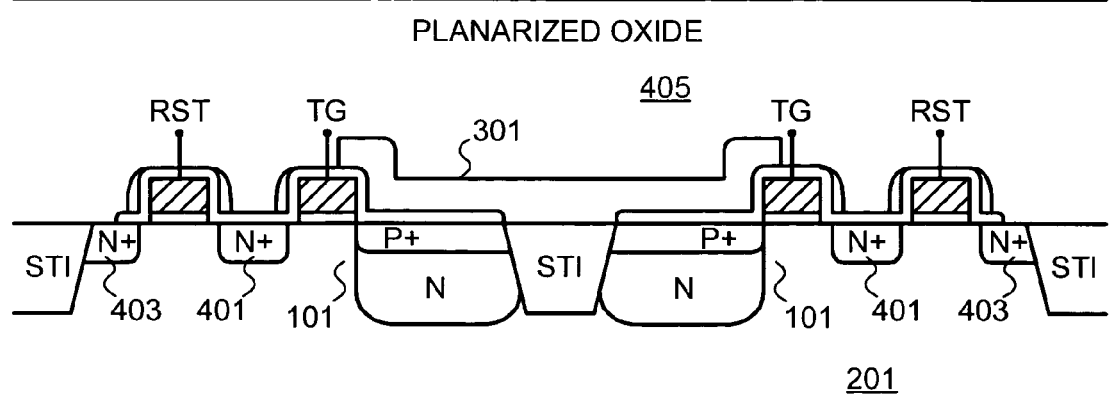

In the embodiment described herein, a thin oxide, such as silicon oxide, is formed, such as by deposition or by thermal growth, over the photodiode silicon surface. After the thin oxide layer is formed, the silicon nitride anti-reflective coating can be deposited. Turning to FIGS. 2–4, one method for forming the anti-reflective coating is shown. Specifically, as seen in FIG. 2, a cross-section view of two adjacent pixels is shown. Two pixels are shown to more accurately reflect the layout of an actual image sensor.

As seen in FIG. 2, photodiodes 101 are formed adjacent to each other in a semiconductor substrate 201. The two pixels 101 are separated by a field oxide, in this example, a shallow trench isolation (STI). Further, the photodiodes shown in FIGS. 2–4 are pinned photodiodes. However, it can be appreciated that the present invention can be applied to any type of light-sensing element. Also shown in FIG. 2 is the transfer transistor that has its transfer gate controlled by a signal TG. Moreover, a reset transistor is formed adjacent to the transfer transistor. The gate of the reset transistor is controlled by the signal RST.

FIG. 2 shows an intermediate structure in the formation of an image sensor. In this intermediate structure, the photodiodes 101 have been formed in the substrate 201 and the P+ pinning layers have also been formed. Furthermore, the gates of the transfer transistors and the reset transistors have also been formed atop of a gate oxide. The polysilicon that forms the gates of the transfer and reset transistors are shown in cross-hatch.

At this point, in accordance with one embodiment of the present invention, a thin oxide is either thermally grown, such as by thermal oxidation of the polysilicon and silicon substrate. The thin oxide 203, alternatively, may be formed by deposition, such as by a chemical vapor deposition or a plasma-enhanced chemical vapor deposition process. In one embodiment, the thin oxide 203 is between 20 and 100 angstroms.

One purpose of the thin oxide 203 is to grow a locally thick oxide at the edge of the polysilicon gates which locally thickens the gate oxide, thereby reduces the electric field at the transistor gate edge, and therefore improves the transistor reliability to high electron degradation.

Turning next to FIG. 3, an anti-reflective coating, such as silicon nitride, is then deposited or otherwise formed. The anti-reflective coating 301 is then patterned and etched so that the anti-reflective coating covers substantially only the photodiode regions 101. In this embodiment, the anti-reflective coating is removed from non-photodiode regions of the image sensor. This may be important because the anti-reflective coating, in the case of silicon nitride, acts as a barrier to hydrogen penetration during alloying steps. If the silicon nitride were to remain, then beneficial hydrogen annealing that reduces silicon/gate oxide surface state density would be blocked.

Again, if a different anti-reflective coating material is used that would allow hydrogen penetration, then it may not be necessary to remove the anti-reflective coating from the non-photodiode regions.

Next, turning to FIG. 4, sidewall spacers are formed on the exposed sidewalls of the transfer gate and the gate of the reset transistor. The sidewall spacers may be formed by deposition of an oxide followed by an etching back process. Then, the $N^+$ regions 401 and 403 are formed in the substrate using implantation techniques. Finally, a planarization layer, such as a planar oxide 405 is formed over the entire pixel.

In summary, it can be seen how an anti-reflective layer can be formed between the planar oxide layer 405 and the underlying photodiode 101. A thin oxide is used as a buffer or stress-relieving layer between the anti-reflective coating 301 and the silicon surface. However, in some embodiments, depending upon the material used for the anti-reflective coating 301, the thin oxide layer may not be absolutely necessary. The use of the anti-reflective coating 301 substantially reduces the amount of reflection of incident light onto the photodiode 101. This causes increased incident light to actually reach the photodiode and therefore generate greater signal.

Figure 5:
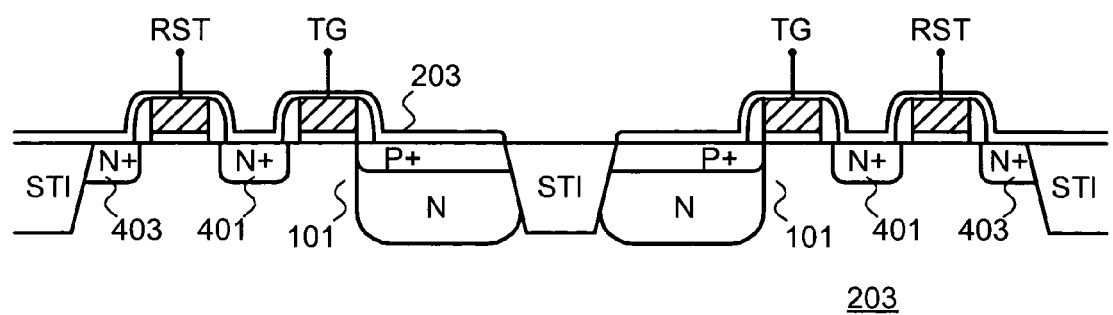
FIGS. 5 and 6 are cross sectional views illustrating an alternative process for manufacturing an anti-reflective coating.
Figure 6:
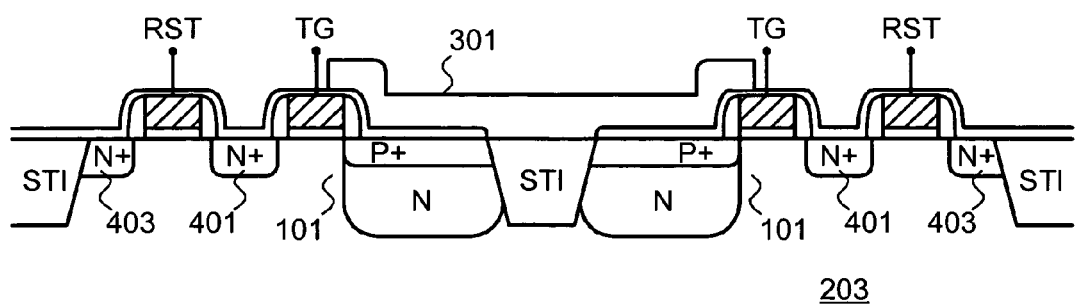

FIGS. 5 and 6 illustrate an alternative method for forming the anti-reflective coating. Specifically, as seen in FIG. 5, after the transfer gates and the reset gates are formed, sidewall spacers are formed on the gates, such as by a blanket deposition of oxide followed by an etchback. Next, typically the N$^+$ regions 401 and 403 are formed in the substrate 203 by ion implantation. Note that the N$^+$ region 401 is the floating node and the N-plus region 403 is typically connected to $V_{DD}$. Next, a thin oxide layer 203 is formed over the exposed polysilicon and the exposed silicon substrate.

Turning to FIG. 6, the anti-reflective coating layer 301 is formed over the pixels and patterned such that it is only covering the photodiodes 101. Again, in one embodiment, a silicon nitride layer is used as the anti-reflection coating.

In yet another alternative embodiment, if sidewall spacers are formed first, then a multilayer ARC [$SiO_xN_y/Si_3N_4/SiO_wN_z$] or an ARC with a graded index of refraction such as $SiO_xN_y/SiO_cN_w/SiO_q/N_u$ may be deposited.

It can be appreciated by those of ordinary skill in the art that the process above may be applied to the 3T pixel design described in FIG. 1A.

From the foregoing, it will be appreciated that specific embodiments of the invention have been described herein for purposes of illustration, but that various modifications may be made without deviating from the spirit and scope of the invention. For example, it may be possible to use the concepts of the present invention with NPN pinned photodiodes, where the dopant types are switched from that shown in the Figures. Accordingly, the invention is not limited except as by the appended claims.

I claim:

1. A pixel comprising:
   a light sensing element formed in a semiconductor substrate having a first index of refraction;
   an anti-reflective coating formed atop said light sensing element; and
   a planarized layer having a second index of refraction and formed directly atop said anti-reflective coating, wherein the anti-reflective coating is transparent to visible light and has an index of refraction between the first and second indexes of refraction, wherein said anti-reflective coating has a thickness approximately calculated as follows:

$$T = \lambda/4\ N$$

where T is the thickness of the anti-reflective coating, λ is a wavelength for an incident light, and N is the index of refraction of the anti-reflective coating.

2. The pixel of claim 1 wherein said light sensing element is selected from the group of photodiode, pinned photodiode, partially pinned photodiode, or photogate.

3. The pixel of claim 1 further including:
   a transfer transistor formed between said light sensing element and a floating node and selectively operative to transfer a signal from said light sensing element to said floating node; and
   an amplification transistor controlled by said floating node.

4. The pixel of claim 1 further including:
   a reset transistor formed between said light sensing element and a node and selectively operative to reset said node to a reference voltage; and
   an amplification transistor controlled by said node.

5. The pixel of claim 1 wherein said light sensing element is a photodiode.

6. The pixel of claim 1 wherein said light sensing element includes a photodiode having a P+ pinning layer on the surface of said semiconductor substrate.

7. The pixel of claim 1 further including a buffer layer between said light sensing element and said anti-reflective coating.

8. The pixel of claim 7 wherein said buffer layer is a thin oxide layer.

9. The pixel of claim 7 wherein said thin oxide layer is silicon dioxide with a thickness of between 20 to 100 angstroms.

10. The pixel of claim 1 wherein the anti-reflective coating has a thickness of between 200–1500 angstroms thick.

11. The pixel of claim 10 wherein the anti-reflective coating has a thickness of between 300–1000 angstroms thick.

12. The pixel of claim 1 incorporated into a CMOS image sensor.

13. The pixel of claim 1 incorporated into a CCD image sensor.

14. The pixel of claim 1 wherein said anti-reflective coating is a multilayered stack.

15. The pixel of claim 14 wherein said multilayered stack includes at least two layers.

16. The pixel of claim 15 wherein said multilayered stack is $SiO_xN_y/Si_3N_4$.

17. The pixel of claim 15 wherein said multilayered stack is $SiO_xN_y/Si_3N_4/SiO_wN_z$.

18. The pixel of claim 1 wherein the anti-reflective coating is an index graded material.

19. The pixel of claim 18 wherein the index graded material is formed by the deposition of $SiO_XN_Y$ wherein the flow of oxygen or nitrogen is varied during the deposition.

20. The pixel of claim 1 wherein said anti-reflective coating is silicon nitride.

21. A pixel comprising:
   a photodiode formed in a semiconductor substrate having a first index of refraction;
   a buffer layer formed atop of said photodiode;
   an anti-reflective coating formed atop said photodiode; and
   a planarized layer having a second index of refraction and formed directly atop said anti-reflective coating, wherein the anti-reflective coating is transparent to visible light and has an index of refraction between the first and second indexes of refraction, wherein said anti-reflective coating has a thickness approximately calculated as follows:

$$T = \lambda/4N$$

where T is the thickness of the anti-reflective coating, λ is a wavelength for an incident light, and N is the index of refraction of the anti-reflective coating.

22. The pixel of claim 21 wherein said photodiode is a pinned photodiode.

23. The pixel of claim 21 further including:
a transfer transistor formed between said photodiode and a floating node and selectively operative to transfer a signal from said photodiode to said floating node; and
an amplification transistor controlled by said floating node.

24. The pixel of claim 21 further including:
a reset transistor formed between said photodiode and a node and selectively operative to reset said node to a reference voltage; and
an amplification transistor controlled by said node.

25. The pixel of claim 21 wherein said buffer layer is silicon oxide.

26. The pixel of claim 21 wherein said anti-reflective coating is silicon nitride.

27. The pixel of claim 21 wherein anti-reflective coating has a thickness of between 200–1500 angstroms thick.

28. The pixel of claim 21 incorporated into a CMOS image sensor.

29. The pixel of claim 21 incorporated into a CCD image sensor.

30. The pixel of claim 21 wherein said anti-reflective coating is a multilayered stack.

31. The pixel of claim 30 wherein said multilayered stack includes at least two layers.

32. The pixel of claim 31 wherein said multilayered stack is $SiO_xN_y/Si_3N_4$.

33. The pixel of claim 31 wherein said multilayered stack is $SiO_xN_y/Si_3N_4/SiO_wN_z$.

34. The pixel of claim 21 wherein the anti-reflective coating is an index graded material.

35. The pixel of claim 34 wherein the index graded material is formed by the deposition of $SiO_XN_Y$ wherein the flow of oxygen or nitrogen is varied during the deposition.

36. A CMOS image sensor comprising:
a plurality of active pixels arranged in rows and columns, at least one of said active pixels comprising:
a light sensing element formed in a semiconductor substrate having a first index of refraction;
an anti-reflective coating formed above said light sensing element; and
a planarized layer having a second index of refraction and formed directly atop said anti-reflective coating, wherein the anti-reflective coating is transparent to visible light and has an index of refraction between the first and second indexes of refraction;
a processing circuit for receiving the output of said active pixels; and
an I/O circuit for outputting the output of said active pixels off of said CMOS image sensor, wherein said anti-reflective coating has a thickness approximately calculated as follows:

$$T=\lambda/4N$$

where T is the thickness of the anti-reflective coating, λ is a wavelength for an incident light, and N is the index of refraction of the anti-reflective coating.

37. The image sensor of claim 36 further wherein said at least one active pixel further includes:
a transfer transistor formed between said light sensing element and a floating node and selectively operative to transfer a signal from said light sensing element to said floating node; and
an amplification transistor controlled by said floating node.

38. The image sensor of claim 37 further including:
a reset transistor formed between said light sensing element and a node and selectively operative to reset said node to a reference voltage; and
an amplification transistor controlled by said node.

39. The image sensor of claim 36 wherein said light sensing element is a photodiode.

40. The image sensor of claim 36 further including a buffer layer between said light sensing element and said anti-reflective coating.

41. The image sensor of claim 36 wherein said buffer layer is a thin oxide layer.

42. The image sensor of claim 41 wherein said thin oxide layer is silicon dioxide with a thickness of between 20 to 100 angstroms.

43. The pixel of claim 36 wherein anti-reflective coating has a thickness of between 200–1500 angstroms thick.

44. The pixel of claim 36 wherein said anti-reflective coating is a multilayered stack.

45. The pixel of claim 44 wherein said multilayered stack includes at least two layers.

46. The pixel of claim 45 wherein said multilayered stack is $SiO_xN_y/Si_3N_4$.

47. The pixel of claim 45 wherein said multilayered stack is $SiO_xN_y/Si_3N_4/SiO_wN_z$.

48. The pixel of claim 36 wherein the anti-reflective coating is an index graded material.

49. The pixel of claim 48 wherein the index graded material is formed by the deposition of $SiO_xN_y$ wherein the flow of oxygen or nitrogen is varied during the deposition.

* * * * *